(12) United States Patent
Lee et al.

(10) Patent No.: US 7,116,556 B2
(45) Date of Patent: Oct. 3, 2006

(54) HEAT SINK MOUNTING APPARATUS

(75) Inventors: Hsieh-Kun Lee, Tu-Cheng (TW); Chun-Chi Chen, Tu-Cheng (TW); Liang-Hui Zhao, Shenzhen (CN)

(73) Assignees: Fu Zhun Precision Industry Co., Ltd., Shenzhen (CN); Foxconn Technology Co., Ltd., Taipei Hsien (TW)

( * ) Notice: Subject to any disclaimer, the term of this patent is extended or adjusted under 35 U.S.C. 154(b) by 200 days.

(21) Appl. No.: 10/974,040

(22) Filed: Oct. 26, 2004

(65) Prior Publication Data

US 2005/0111192 A1    May 26, 2005

(30) Foreign Application Priority Data

Nov. 21, 2003   (CN)  ................... 2003 2 0118518

(51) Int. Cl.
   *H05K 7/20*    (2006.01)
   *A41F 1/00*    (2006.01)
(52) U.S. Cl. ............... 361/704; 361/719; 257/718; 257/719; 257/727; 24/453; 24/458; 165/80.3; 165/185
(58) Field of Classification Search .......... 24/453, 24/458
   See application file for complete search history.

(56) References Cited

U.S. PATENT DOCUMENTS

| 5,384,940 | A | | 1/1995 | Soule et al. | |
|---|---|---|---|---|---|
| 6,104,614 | A | * | 8/2000 | Chou et al. | 361/704 |
| 6,307,748 | B1 | * | 10/2001 | Lin et al. | 361/704 |
| 6,412,546 | B1 | * | 7/2002 | Lin et al. | 165/80.3 |
| 6,697,256 | B1 | * | 2/2004 | Horng et al. | 361/704 |

\* cited by examiner

*Primary Examiner*—Boris Chervinsky
(74) *Attorney, Agent, or Firm*—Morris, Manning & Martin; Tim Tingkang Xia, Esq.

(57) ABSTRACT

A mounting apparatus (1) includes a locking pin (10) and an operation member (20) attaching to the locking pin. Resilient prongs (13) are formed at a first end of the locking pin. A detent (16) is formed at a periphery of the locking pin. The operation member comprises a compressing portion (21) capable of compressing the prongs radially to a predetermined compressed state when the operation member moves axially in a first direction from the second end to the first end and capable of releasing the prongs when the operation member moves axially in an opposite second direction to allow the prongs to return to their original states, and a catch (24) to engage with the detent to prevent movement of the operation member in the second direction to maintain the prongs at the predetermined compressed state.

27 Claims, 6 Drawing Sheets

HEAT SINK MOUNTING APPARATUS

TECHNICAL FIELD

The present invention relates generally to mounting apparatuses, and more particularly to an apparatus for mounting a heat sink on an electronic package mounted on a printed circuit board (PCB).

BACKGROUND

Mounting apparatuses for mounting two components together are often used in the industry. In the computer technology, for example, a heat sink is often disposed on an electronic package mounted on a PCB to dissipate heat generated by the electronic package. To obtain a good thermal performance, the heat sink must be secured to the PCB to enable the bottom of the heat sink to ultimately contact the electronic package.

FIG. 6 shows a conventional heat sink assembly. The assembly comprises a PCB 500 with an electronic package 600 mounted thereon, and a heat sink 400 mounted on the PCB 500 by a plurality of locking pins 100. Each locking pin 100 extends through mounting holes (not shown) defined in the heat sink 400 and the PCB 500. A spring 300 is disposed around the locking pin 100 and resiliently abuts against a top face of the heat sink 400. A bottom end 210 of the locking pin 100 enlarges in diameter to engage at an underside of the PCB. A slot 220 is defined in the bottom end 210 to separate the bottom end 210 into two resilient parts. In assembly, the locking pins 100 are inserted into the mounting holes of the heat sink 400 and the PCB 500. The bottom end 210 of each locking pin 10 is compressed by the heat sink 400 and the PCB 500 and released to its original state to engage the underside of the PCB 500 after the bottom end 210 completely passes the mounting hole of the PCB 500.

However, during the insertion, the bottom end 210 of each locking pin 100 scratches the heat sink 400 and the PCB 500 at the mounting holes. The heat sink 400 and the PCB 500 are prone to be damaged by the locking pins 10. In addition, a large pressing force is required to press the locking pin 10 into the mounting holes of the heat sink 400 and the PCB 500. To protect the heat sink 400 and the PCB 500 from being damaged, the operator must operate the locking pin 10 gently. This results in a low mounting efficiency.

For the foregoing reasons, a mounting apparatus which can mount two components together without damaging the components and which has an enhanced mounting efficiency is desired.

SUMMARY OF THE INVENTION

The present invention is directed to a mounting apparatus which can reduce the possibility of damaging the components to be mounted.

The present invention is also directed to a mounting apparatus which has an enhanced mounting efficiency.

A mounting apparatus according to the invention comprises a locking pin and an operation member attaching to the locking pin. The locking pin at a first end thereof comprises at least two resilient prongs. A detent is formed at a periphery of the locking pin. The operation member comprises a compressing portion capable of compressing the prongs radially to a predetermined compressed state when the operation member moves axially in a first direction from an opposite second end to the first end and capable of releasing the prongs when the operation member moves axially in an opposite second direction to allow the prongs to return to their original states, and a catch to engage with the detent to prevent movement of the operation member in the second direction to maintain the prongs at the predetermined compressed state.

Other objects, advantages and novel features of the present invention will be drawn from the following detailed description of the preferred embodiments of the present invention with attached drawings, in which:

DESCRIPTION OF PREFERRED EMBODIMENTS

Figure 1:
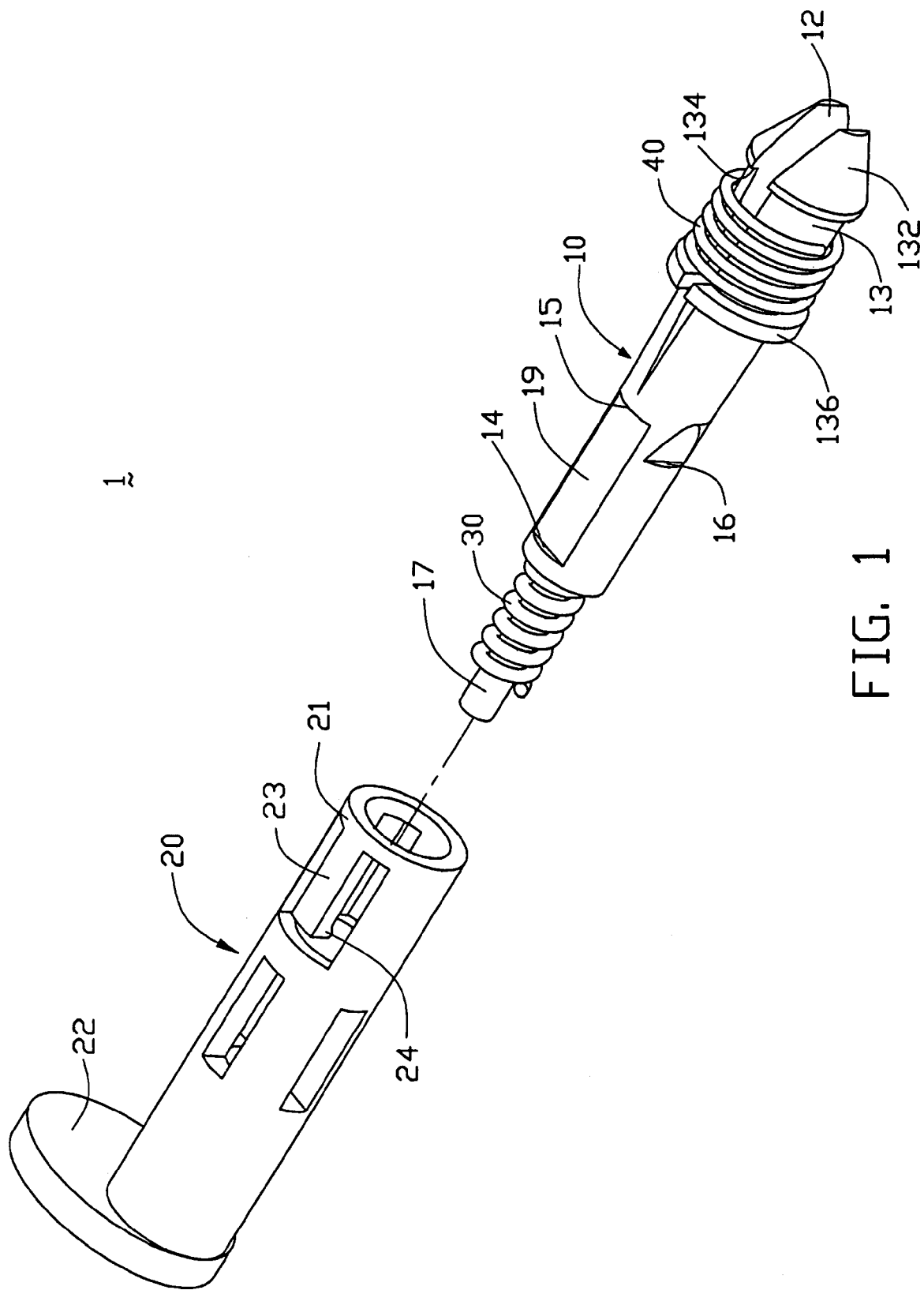
FIG. 1 is an exploded perspective view of a heat sink mounting apparatus according to a preferred embodiment of the present invention.
Figure 2:
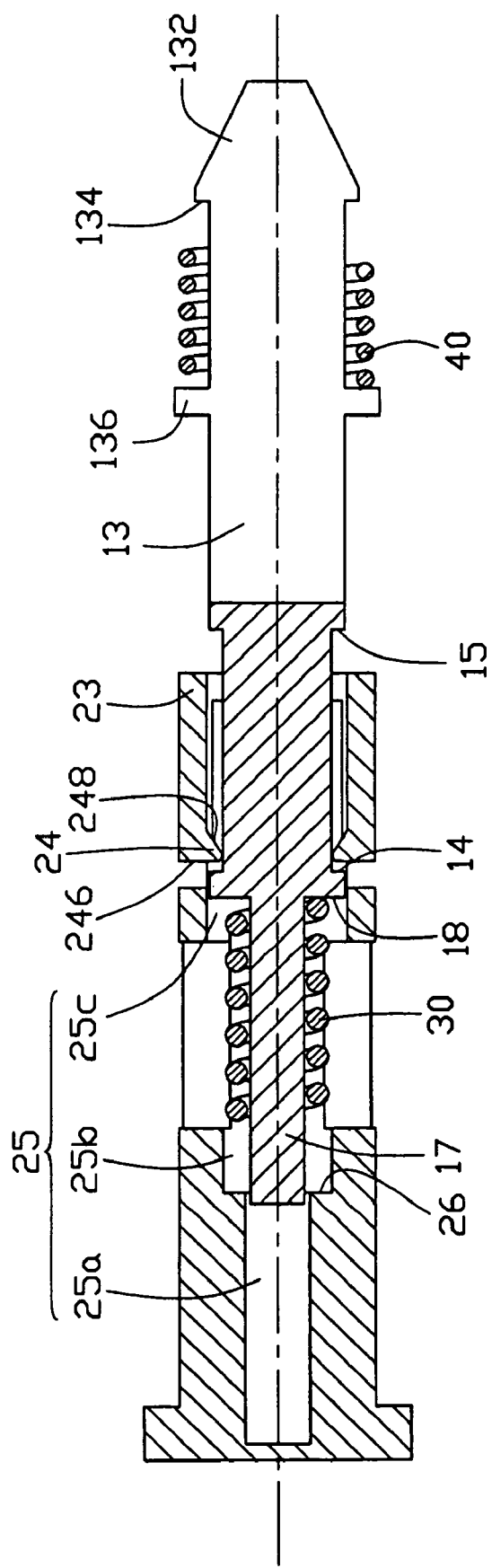
FIG. 2 is an enlarged, assembly, cross sectional view of the mounting apparatus of FIG. 1.

Referring to FIGS. 1 and 2, a heat sink mounting apparatus 1 according to a preferred embodiment of the present invention comprises a locking pin 10 and an operation member 20 detachably attaching to the locking pin 10.

The locking pin 10 longitudinally defines therein a slot 12 in a first end thereof. As a result, the slot 12 effectively divides the first end of the locking pin 10 into two resilient prongs 13. In normal state, the prongs 13 deform outwardly. The diameter of the locking pin 10 at the prongs 13 is greater than that at an opposite second end thereof, and the diameter of the locking pin 10 at the prongs 13 gradually increases along a first direction which points from the second end to the first end of locking pin 10. The prongs 13 can be compressed toward each other to reduce the diameter thereof, and when the compressive forces are removed, the prongs 13 can return to their original positions. Alternatively, three or more prongs 13 may be formed at the first end of the locking pin 10.

Each prong 13 expands radially adjacent a free end thereof to form an expanded portion thereat. The expanded portions of the two prongs 13 cooperatively form a cone-shaped expanded head 132. The expanded head 132 has an engaging surface 134 substantially perpendicular to an axis of the locking pin 10. An annular flange 136 is formed on the prongs 13 of the locking pin 10. The flange 136 is divided into two parts by the slot 12. A first spring member such as a first helical spring 40 is disposed around the locking pin 10 between the expanded head 132 and the flange 136.

A pair of cutouts 19 is longitudinally and symmetrically defined at an outer periphery of the locking pin 10 adjacent the second end thereof. An outer step 14 and an inner step 15 are thus respectively formed at opposite ends of each cutout 19. Materials are cut away from the locking pin 10 adjacent the inner steps 15 to form a pair of detents 16 thereat. An axial distance between the inner steps 15 and the slot 12 is less than an axial distance between the detent 16 and the slot 12. The cutouts 19 are arranged adjacent the detents 16 in a circumferential direction. In this preferred embodiment, the cutouts 19 and the detents 16 are spaced circumferentially at about 90 degrees.

An extension 17 extends axially from the second end of the locking pin 10. A diameter of the extension 17 is less than the diameter of the locking pin 10 at the second end. Therefore, a shoulder 18 is formed at the junction of the extension 17 and the locking pin 10. A second spring member such as a second helical spring 30 is disposed around the extension 17.

The operation member 20 defines an axial hole 25 therein. The axial hole 25 has three consecutive sections, i.e., an inner section 25a, a middle section 25b and an outer section 25c. The inner section 25a is for receiving the extension 17 therein and is a little greater in diameter than the extension 17 to allow the extension 17 to easily insert into or withdraw from the inner section 25a. The middle section 25b is for receiving the second helical spring 30 and has a diameter substantially the same as that of the second helical spring 30. The outer section 25c is for receiving the locking pin 10. A diameter of the outer section 25c is substantially the same as that of the locking pin 10 at the second end thereof that has no slot 12, but is less than that of the locking pin 10 at the first end where the slot 12 is defined. The inner section 25a is smaller than the middle section 25b, so that a stop wall 26 is formed at a junction of the inner and middle sections 25a, 25b.

The operation member 20 has an annular compressing portion 21 at an outer open end thereof. The compressing portion 21 is for compressing the prongs 13 of the locking pin 10 which will be more detailed hereinafter. The operation member 20 forms a pair of symmetrical spring fingers 23 near the outer end thereof. Each spring finger 23 is formed by removing a piece of generally U-shaped material from the operation member 20. The free end of each spring finger 23 extends radially and inwardly to form a catch 24. The catch 24 is for selectively engaging with the outer step 14 and the detent 16 which will be more detailed hereinafter. Each catch 24 has a straight locking face 246 facing to an inner end of the operation member 20 and a guide face 248 inclined to the axis of the axial hole 25. The radial distance between the catches 24 is substantially equal to the radial distance between the cutouts 19 of the locking pin 10.

A handle 22 is formed at the inner end of the operation member 20 for facilitating operation thereof.

In assembly of the mounting apparatus 1, the spring fingers 23 are aligned with the cutouts 19 of the locking pin 10 respectively. The operation member 20 is then pushed toward the locking pin 10 to receive the locking pin 10 therein. When the catches 24 of the spring fingers 23 reach the shoulder 18 of the locking pin 10, the guide faces 248 of the catches 24 slidingly engage with an outer edge of the shoulder 18 to cause the spring fingers 23 to deform outwardly. Thus, the catches 24 ride over the shoulder 18. Once the catches 24 have completely ridden over the shoulder 18 and enter into the cutout 19, the spring fingers 23 return to their original state. Thus, the operation member 20 is slidably attached to the locking pin 10, and the assembly of the mounting apparatus 1 is accomplished.

In this state, the operation member 20 can move in the first or second direction with respective to the locking pin 10 by pulling or pushing the operation member 20. When the operation member 20 moves in the second direction to a predetermined position, the locking faces 246 of the catches 24 contact the outer steps 14 respectively, thereby preventing the operation member 20 from accidentally coming off the locking pin 10.

Figure 3:
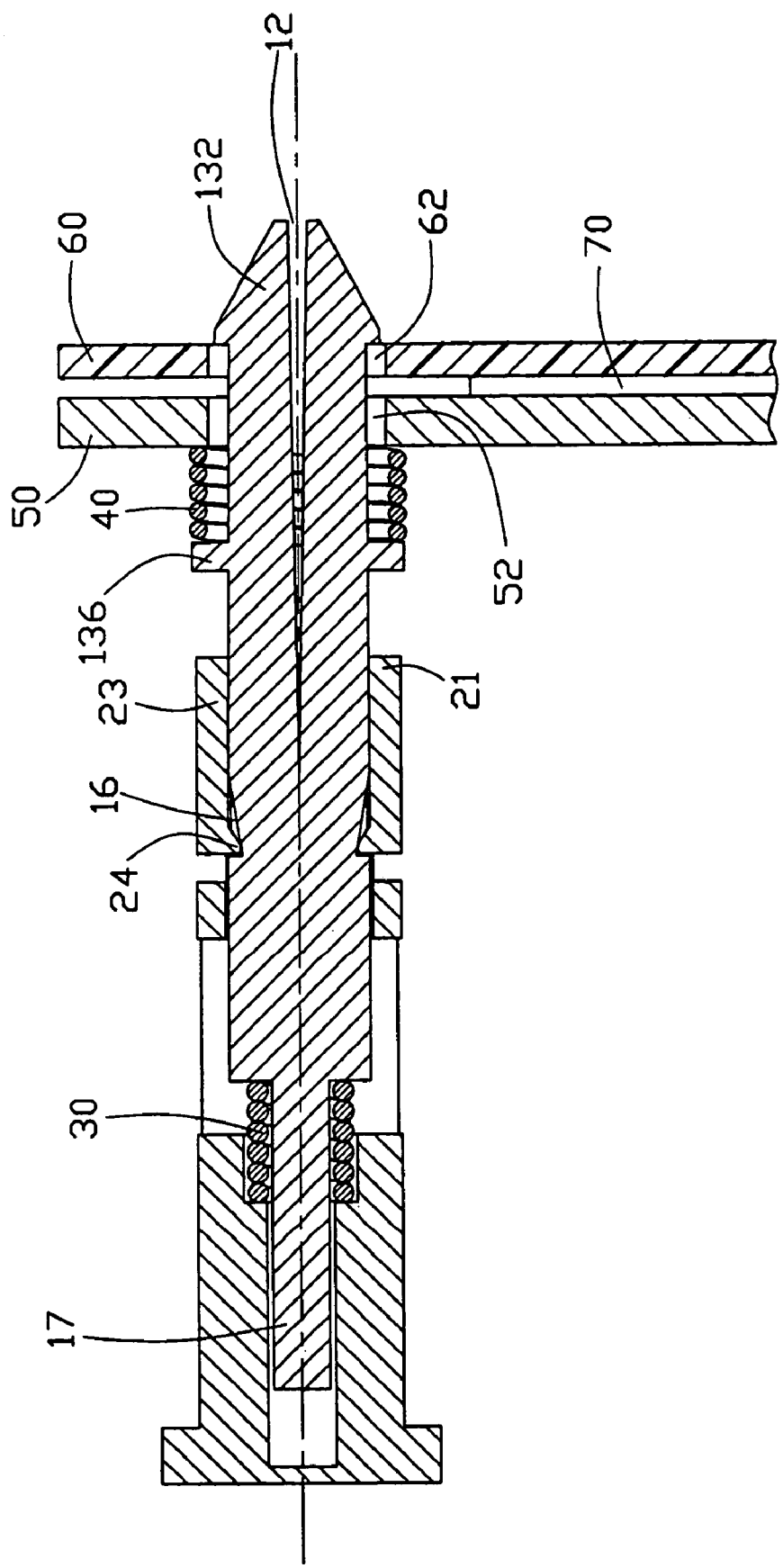
FIG. 3 is a partly assembled view of a heat sink assembly using the mounting apparatus of FIG. 1.
Figure 4:
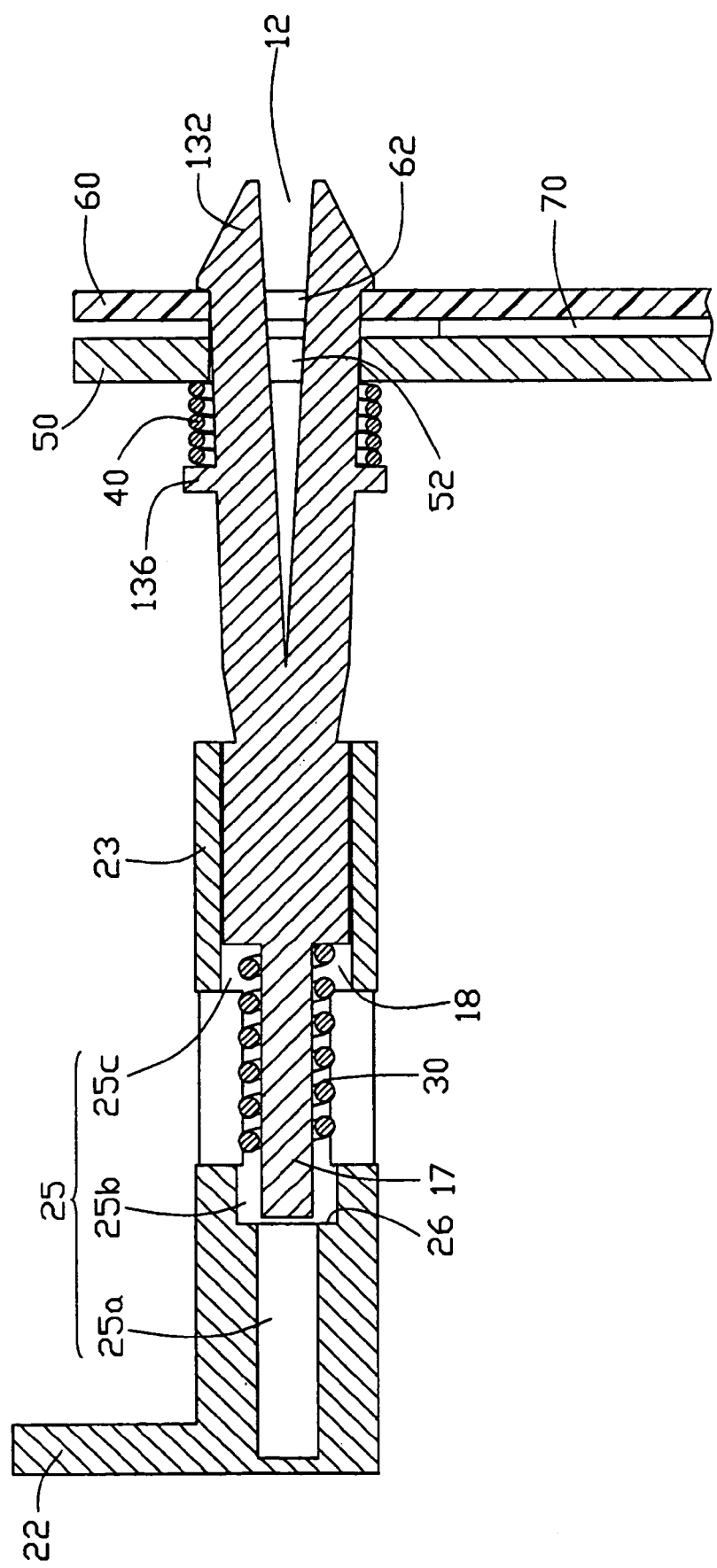
FIG. 4 is fully assembled view of FIG. 3.

Referring to FIGS. 3 and 4, as an exemplification, the mounting apparatus 1 is employed to join a heat sink 50 and a PCB 60 having an electronic package 70 mounted thereon. Understandably, the mounted apparatus 1 of the present invention can be employed to joint members other than the heat sink 50 and the PCB 60. The heat sink 50 and the PCB 60 respectively define aligned position holes 52, 62 for extension of the mounting apparatus 1. The diameter of the mounting hole 52, 62 is less than that of the expanded head 132 of the locking pin 10 when no compressive force is applied to the prongs 13.

Prior to extension of the locking pin 10 through the mounting holes 52, 62, the operation member 20 is moved in the first direction with respect to the locking pin 10 to cause the compressing portion 21 of the operation member 20 to continuously compress the prongs 13 of the locking pin 10. As a result, the diameter of the locking pin 10 at the prongs 13 as well as the expanded head 132 gradually reduces. As the operation member 20 continuously moves toward the expanded head 132, the extension 17 enters into the inner section 25a of the axial hole 25 of the operation member 20, and the stop wall 26 of the operation member 20 and the shoulder 18 of the locking pin 10 compress the second helical spring 30. The compressed second helical spring 30 generates a resilient force against the operation member 20 to resist further movement thereof. When the diameter of the expanded head 132 becomes less than the diameter of the mounting holes 52, 62, the operation member 20 is rotated about its axis so that the catches 24 of the spring fingers 23 slide circumferentially to the detents 16 of the locking pin 10 respectively. The operation member 20 is then released. The catches 24 thus resiliently engage with the detents 16 respectively due to the resistant force of the second helical spring 30 exerted on the operation member 20. By this engagement, the operation member 20 is prevented from moving in the second direction and thus exerts constant compressive forces on the prongs 13 with its compressing portion 21 to maintain the expanded head 132 to have a reduced diameter less than the diameter of the mounting holes 52, 62.

Then, the locking pin 10 is pushed to extend through the mounting holes 52, 62 of the heat sink 50 and PCB 60 with its expanded head 132 located completely below an underside of the PCB 60. The first helical spring 40 is compressed and resiliently engages with a top of the heat sink 50 around the mounting hole 52 thereof.

Afterwards, the operation member 20 is rotated about its axis so that the catches 24 of the spring fingers 23 disengage from the detents 16 and slide circumferentially into the cutouts 19 respectively. Finally, the operation member 20 is released. The operation member 20 is pushed by the resilient force of the second helical spring 30 to move in the second direction until the outer steps 14 of the locking pin 10 stop the catches 24. The prongs 13 are thus released and deform outwardly to their original states. The expanded head 132 expands outwardly to engage with the PCB thereunder. The heat sink 50 is thus secured to the PCB 60 with the electronic package 70 sandwiched therebetween, as shown in FIG. 4

To remove the heat sink 50 from the PCB 60, the operation member 20 is pushed in the first direction to cause the diameter of the expanded head 132 less than that of the mounting holes 52, 62 of the heat sink 50 and the PCB 60. The operation member 20 is then rotated about the axis of the locking pin 10 to enable the catches 24 to engage with the detents 16 of the locking pin 10, so that the diameter of the expanded head 132 maintains to be less than that of the mounting holes 52, 62. Finally, the locking pin 10 can be easily removed from the mounting holes 52, 62.

In the mounting apparatus 1 of the present invention, the operation member 20 enables the locking pin 10 to be smaller in diameter than the mounting holes 52, 62 of the heat sink 50 and the PCB 60 prior to assembly. The locking pin 10 thus extends through the mounting holes 52, 62 without scratching the heat sink 50 and the PCB 60 at the mounting holes 52, 62 and thus reduces the possibility of damaging the heat sink 50 and the PCB 60 in assembly. In addition, in an electrical enclosure housing the heat sink 50 and the PCB 60, the operation member 20 needs only to be rotated about its axis, other operations requiring a greater operational force and a larger space such as the operation on the operation member 20 to reduce the diameter of the locking pin 10 prior to the insertion of locking pin 10 into the mounting holes 52, 62 of the heat sink 50 and PCB 60 can be performed outside the electronic enclosure in advance. The mounting efficiency is thus enhanced.

Figure 5:
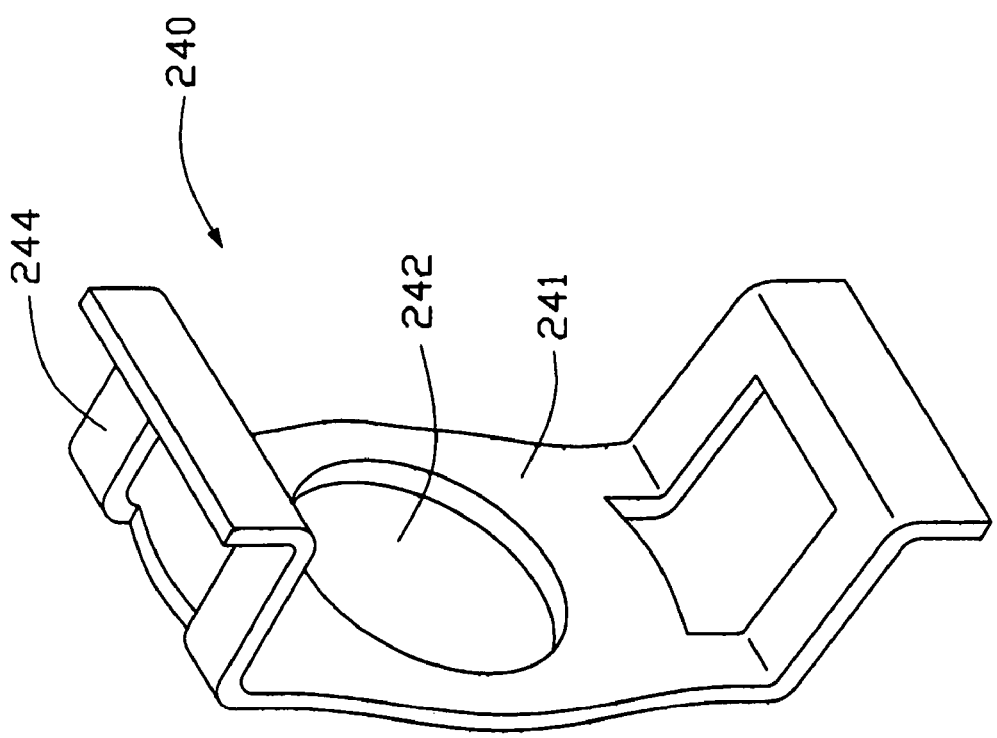
FIG. 5 is a perspective view of the spring member of the mounting apparatus according to an alternative embodiment of the present invention.
Figure 6:
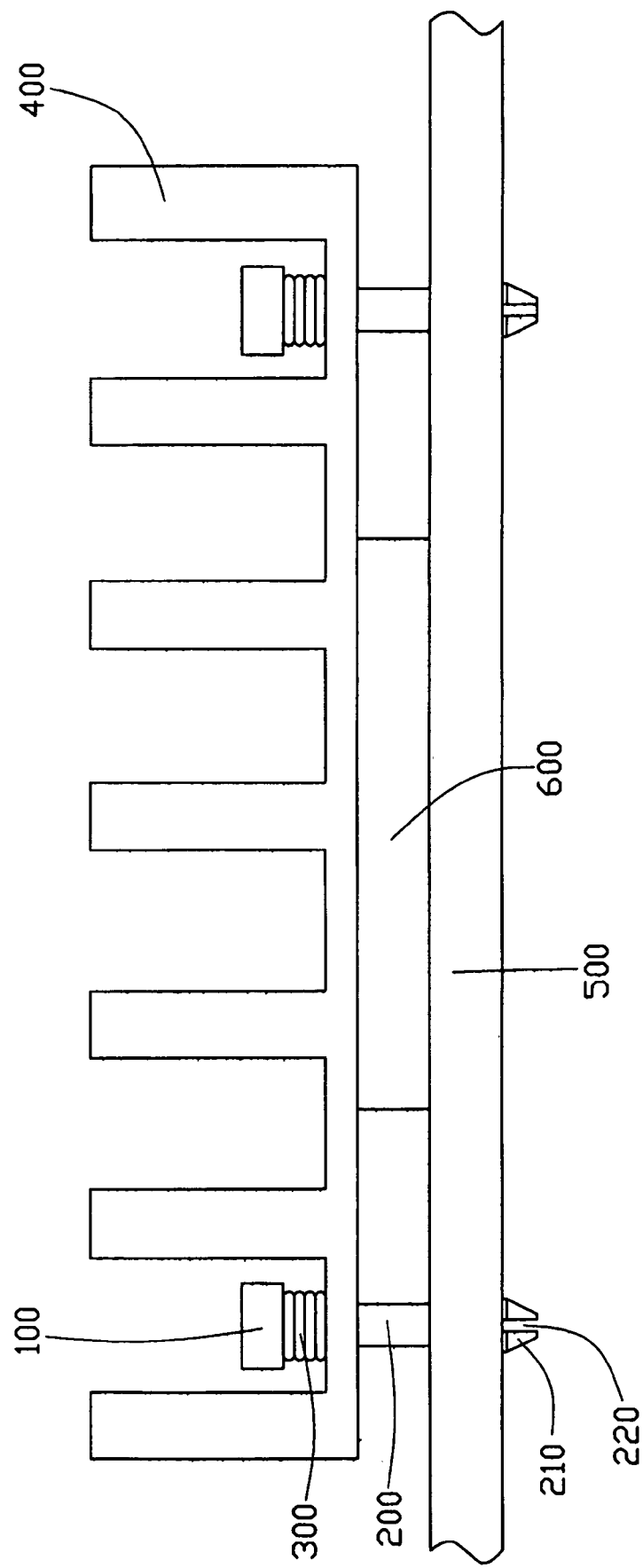
FIG. 6 is an elevation view of a conventional heat sink assembly.

Referring to FIG. 5, a first spring member 240 in accordance with an alternative embodiment of the present invention comprises a main plate 241 defining an annular opening 242 therein and two resilient legs 244 extending from opposite sides of the main plate 241. The first spring member 240 is surroundingly attached to the locking pin 10 between the flange 136 and the expanded head 132 thereof via the opening 242 of the first spring member 240. The first spring member 240 functions in the same way as the first helical spring 40 in the preferred embodiment to resiliently engage the top of the heat sink.

It is understood that the invention may be embodied in other forms without departing from the spirit thereof. The above-described examples and embodiments are to be considered in all respects as illustrative and not restrictive, and the invention is not to be limited to the details given above.

What is claimed is:

1. A mounting apparatus comprising:
   a locking pin comprising opposite first and second ends, the locking pin at the first end thereof comprising at least two resilient prongs, a detent being formed at a periphery of the locking pin; and
   an operation member attaching to the locking pin, the operation member comprising:
   a compressing portion capable of compressing the prongs radially to a predetermined compressed state when the operation member moves axially in a first direction from the second end to the first end and capable of releasing the prongs when the operation member moves axially in an opposite second direction to allow the prongs to return to their original states; and
   a catch to engage with the detent to prevent movement of the operation member in the second direction to maintain the prongs at the predetermined compressed state.

2. The mounting apparatus as described in claim 1, wherein the locking pin defines a slot at the first end thereof to form the resilient prongs.

3. The mounting apparatus as described in claim 2, wherein the prongs deform outwardly when no compressive force is applied thereon so that the diameter of the locking pin at the prongs gradually increases along the first direction.

4. The mounting apparatus as described in claim 2, wherein the locking pin comprises an expanded head formed on the prongs adjacent the first end thereof, and the expanded head is separated by the slot.

5. The mounting apparatus as described in claim 2, wherein the locking pin comprises a flange formed on the prongs spacing from the expanded head.

6. The mounting apparatus as described in claim 5, further comprising a first spring member attach to the locking pin between the flange and the expanded head.

7. The mounting apparatus as described in claim 6, wherein the first spring member comprises a first helical spring surrounding the locking pin.

8. The mounting apparatus as described in claim 6, wherein the first spring member comprises a main plate having an opening allowing extension of the locking pin, and at least two resilient legs extending from sides of the main plate.

9. The mounting apparatus as described in claim 1, wherein the detent is formed by cutting away a material of the locking pin at the periphery thereof.

10. The mounting apparatus as described in claim 1, wherein the locking pin defines a longitudinal cutout at the periphery thereof for slidably receiving the catch therein, and the cutout is adjacent the detent in a circumferential direction so that the catch can move between the cutout and the detent by rotation of the operation member about the axis of the locking pin.

11. The mounting apparatus as described in claim 10, wherein an outer step is formed at an end of the cutout that is adjacent the second end of the locking pin, the outer step is able to engage with the catch to prevent the locking pin from moving in the second direction.

12. The mounting apparatus as described in claim 10, wherein the operation member defines an axial hole to receive the locking pin therein.

13. The mounting apparatus as described in claim 12, wherein the compressing portion is formed at an open end of the operation member.

14. The mounting apparatus as described in claim 12, wherein the operation member comprises a spring finger formed in a periphery wall thereof, and the catch is formed at a free end of the spring finger.

15. The mounting apparatus as described in claim 14, wherein the catch defines a locking face substantially perpendicular to an axis of the locking pin to engage with the detent and an guiding face inclined to the axis of the locking pin.

16. The mounting apparatus as described in claim 12, wherein the operation member comprises a stop wall, the locking pin at the second end thereof forms an axial extension smaller in diameter than the locking pin at the second end so that a shoulder is formed at the second end, the mounting apparatus further comprises a second spring member disposed between the stop wall and the shoulder, and the spring member is compressed by the shoulder and the stop wall to generate a resist force toward the second direction when the operation member moves in the first direction.

17. A heat sink assembly comprising:
   a printed circuit board with an electronic package mounted on one side thereof;
   a heat sink in thermally contact with the electronic package;
   mounting holes defined in the printed circuit board and the heat sink;
   a locking pin comprising at a first end thereof a plurality of resilient prongs with a slot defined between the prongs, the prongs extending through the mounting holes;
   an expanded head formed at the first end of the locking pin and engaging with the printed circuit board at an opposite side thereof;

a first spring member attached to the locking pin and resiliently bearing against the heat sink toward the printed circuit board;

a detent formed on the locking pin; and an operation member attached to an opposite second end of the locking pin, the operation member comprising:

a compressing portion capable of compressing the prongs to reduce the diameter of the locking pin at the prongs to a value less than a diameter of the mounting holes when the operation member moves in a first direction which points from the second end to the first end; and a catch for engaging with the detent to prevent movement of the operation member with respect to the locking pin in an opposite second direction to maintain the diameter of the locking pin at the prongs to be said value.

18. The heat sink assembly as described in claim 17, wherein when no compressive force is applied to the prongs, the prongs deform outwardly so that the diameter of the locking pin at the prongs gradually increases along the first direction.

19. The heat sink assembly as described in claim 17, wherein the locking pin comprises a flange formed on the prongs engaging with the first spring member.

20. The heat sink assembly as described in claim 17, wherein the first spring member comprises a first helical spring surrounding the prongs.

21. The heat sink assembly as described in claim 17, wherein the locking pin defines a longitudinal cutout at the periphery thereof for slidably receiving the catch therein when the operation member moves axially along the locking pin, and the cutout is adjacent the detent in a circumferential direction so that the catch can move between the cutout and the detent by rotation of the operation member about an axis of the locking pin.

22. The heat sink assembly as described in claim 21, wherein an outer step is formed at an end of the cutout that is adjacent the second end of the locking pin, and the outer step is able to engage with the catch to prevent the operation member from moving with respect to the locking pin in the second direction.

23. The heat sink assembly as described in claim 17, wherein the operation member defines an axial hole receiving the locking pin therein and an inner stop wall, the locking pin at the second end thereof forms an axial extension smaller in diameter than the locking pin at the second end so that a shoulder is formed thereat, the mounting apparatus further comprises a second spring member disposed between the stop wall and the shoulder, and the second spring member is compressed by the shoulder and the stop wall to generate a resist force toward the second direction when the operation member moves along the locking pin in the first direction.

24. The heat sink assembly as described in claim 23, wherein the compressing portion is formed at an open end of the operation member.

25. The heat sink assembly as described in claim 23, wherein the operation member comprises a spring finger formed in a periphery wall thereof, and the catch is formed at a free end of the spring finger.

26. A mounting apparatus for enhancing contact force between two joint members, comprising:

a locking pin comprising at least one retractable prong formed at one end thereof, said at least one prong capable of provision of said enhanced contact force between said two joint members in a normal state and of being movable through said two joint members without force enhancement therebetween in a retracted state;

an operation member attachable to said locking pin, said operation member comprising a compressing portion movable between a first position of restraining said at least one prong of said locking pin from said normal state to said retracted state thereof, and a second position of release of said at least one prong; and a catch disposed to hold said operation member at said first position in case of movement of said operation member from said second position to said first position.

27. The mounting apparatus as described in claim 26, wherein said catch is rotary to move from a position of holding said operation member to another position of resilient release of said operation member.

* * * * *